United States Patent
Chen et al.

(10) Patent No.: US 9,726,713 B2
(45) Date of Patent: Aug. 8, 2017

(54) TESTING METHOD AND TESTING SYSTEM FOR SEMICONDUCTOR ELEMENT

(71) Applicant: Industrial Technology Research Institute, Hsinchu (TW)

(72) Inventors: Tzung-Te Chen, Taipei (TW); Chun-Fan Dai, Kaohsiung (TW); Han-Kuei Fu, New Taipei (TW); Chien-Ping Wang, Hsinchu County (TW); Pei-Ting Chou, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 862 days.

(21) Appl. No.: 13/863,383

(22) Filed: Apr. 16, 2013

(65) Prior Publication Data

US 2014/0107961 A1 Apr. 17, 2014

(30) Foreign Application Priority Data

Oct. 11, 2012 (TW) .............................. 101137506 A (51) Int. Cl.
*G01R 31/26* (2014.01)
*G01R 31/00* (2006.01)
*G01R 31/27* (2006.01)

(52) U.S. Cl.
CPC ....... *G01R 31/2644* (2013.01); *G01R 31/001* (2013.01); *G01R 31/2603* (2013.01); *G01R 31/275* (2013.01)

(58) Field of Classification Search
CPC .............. G01R 31/2644; G01R 31/001; G01R 31/2603; G01R 31/275
See application file for complete search history.

(56) References Cited

U.S. PATENT DOCUMENTS 5,914,501 A 6/1999 Antle et al.
5,977,565 A 11/1999 Ishikawa et al.
(Continued)

FOREIGN PATENT DOCUMENTS

CN 1633710 6/2005
CN 1679033 10/2005
(Continued)

OTHER PUBLICATIONS

Shei et al., Improved Reliability and ESD Characteristics of Flip-Chip GaN-Based LEDs With Internal Inverse-Parallel Protection Diodes, 2007, IEEE, pp. 346-349.*
(Continued)

*Primary Examiner* — John Breene
*Assistant Examiner* — Mohammad Islam
(74) *Attorney, Agent, or Firm* — Jianq Chyun IP Office (57) ABSTRACT

A testing method and testing system for a semiconductor element are provided. The method includes following steps. A level of a testing electrostatic discharge (ESD) voltage is determined. A plurality of sample components is provided. The testing ESD voltage is imposed on the sample components for testing ESD decay rates of the sample components. ESD withstand voltages of the sample components are detected. The relation between the ESD withstand voltages and the electrostatic discharge rates are recorded to a database. The testing ESD voltage is imposed on the semiconductor element for testing an ESD decay rate of the semiconductor element. The database is looked up according to the ESD decay rate of the semiconductor element to determine an ESD withstand voltage of the semiconductor element.

10 Claims, 7 Drawing Sheets

(56) References Cited

U.S. PATENT DOCUMENTS

| | | | |
|---|---|---|---|
| 6,603,152 B2 | 8/2003 | Song et al. | |
| 6,898,061 B1* | 5/2005 | Kimber | H03K 17/0826 361/56 |
| 7,853,909 B2 | 12/2010 | Kobayashi et al. | |
| 8,089,744 B1* | 1/2012 | Rahim | H01L 27/0277 361/111 |
| 2003/0006776 A1* | 1/2003 | Wendel | G01R 31/129 324/457 |
| 2004/0082083 A1* | 4/2004 | Kraz | G01R 31/18 438/14 |
| 2005/0172246 A1* | 8/2005 | Logie | G06F 17/5036 716/115 |
| 2006/0109596 A1* | 5/2006 | Hayashi | G06F 17/5036 361/56 |
| 2008/0004820 A1* | 1/2008 | Nakaie | G01R 27/04 702/65 |
| 2008/0104554 A1 | 5/2008 | Kobayashi et al. | |
| 2009/0171635 A1* | 7/2009 | Jang | G06F 17/5036 703/2 |
| 2010/0237877 A1* | 9/2010 | Hsu | G01R 31/025 324/551 |
| 2011/0022376 A1 | 1/2011 | Kobayashi et al. | |
| 2011/0156031 A1* | 6/2011 | Kim | H01L 22/32 257/48 |
| 2012/0176710 A1* | 7/2012 | Domanski | H01L 27/0285 361/56 |

FOREIGN PATENT DOCUMENTS

| | | |
|---|---|---|
| CN | 1790041 | 6/2006 |
| CN | 1988307 | 6/2007 |
| CN | 201917616 | 8/2011 |
| CN | 102341713 | 2/2012 |
| TW | 200809217 | 2/2008 |
| TW | 200951466 | 12/2009 |
| TW | 201131179 | 9/2011 |

OTHER PUBLICATIONS

Baumgartner, Electrostatic Decay Measurement Theory and Applications, 1995, IEEE, pp. 5.7.1-5.7.11.*
"Office Action of Taiwan Counterpart Application", issued on Mar. 17, 2014, p. 1-p. 4.
Liu et al., "High-temperature high-humidity and electrical static discharge stress effects on GaN p—i—n UV sensor", Materials Science and Engineering B, Feb. 2005, vol. 121, p. 29-p. 33.
Su et al., "ESD Engineering of Nitride-Based LEDs", IEEE Transactions on Device and Materials Reliability, Jun. 2005, vol. 5, p. 277-p. 281.
Chiang et al., "Improved Optical and ESD Characteristics for GaN-Based LEDs With an n-GaN Laye", IEEE Transactions on Device and Materials Reliability, Mar. 2011,vol. 11, p. 76-p. 80.
Tsai et al., "High Efficiency and Improved ESD Characteristics of GaN-Based LEDs With Naturally Textured Surface Grown by MOCVD", IEEE Photonics Technology Letters, Jun. 1, 2006, vol. 18,p. 1213-p. 1215.
Jang et al., "Effect of Thickness of the p—AlGaN Electron Blocking Layer on the Improvement of ESD Characteristics in GaN-Based LEDs", IEEE Photonics Technology Letters, Jul. 1, 2008, vol. 20, p. 1142-p. 1144.
Cao et al., "Microstructural origin of leakage current in GaN/InGaN light-emitting diodes", Journal of Crystal Growth, Jan. 2004, vol. 264, p. 172-p. 177.

* cited by examiner

TESTING METHOD AND TESTING SYSTEM FOR SEMICONDUCTOR ELEMENT

CROSS-REFERENCE TO RELATED APPLICATION

This application claims the priority benefit of Taiwan application serial no. 101137506, filed on Oct. 11, 2012. The entirety of the above-mentioned patent application is hereby incorporated by reference herein and made a part of this specification.

BACKGROUND

Technical Field

The disclosure relates to a testing for a semiconductor element. Particularly, the disclosure relates to a testing method for semiconductor electrostatic discharge (ESD) tolerance and a testing system thereof.

Related Art

Damage caused by ESD is the most common reason that causes failure of the semiconductor elements, which is easy to cause severe damage of application products.

A general testing method for ESD tolerance of a semiconductor element is limited to a destructive testing method. The destructive testing method is to impose gradually increased ESD voltages to the semiconductor element to impact the tested semiconductor element until it fails, so as to detect a limit of the tested semiconductor element for the ESD tolerance. However, since the ESD testing method is destructive, it is easy to cause detriment to the semiconductor elements, so that samples are selected by sample inspection to represent all of the elements, by which a manufacturer cannot conduct a comprehensive test on the ESD tolerance to achieve a purpose of grading the manufactured products, which directly influences reliability of the products and a benefit of price differentiation.

Therefore, how to resolve the problem that the manufacturer cannot, conducting a comprehensive testing on the ESD tolerance to achieve the purpose of grading the manufactured products through a non-destructive testing method for ESD tolerance, becomes an issue worthy of further exploration.

SUMMARY

An embodiment of the disclosure provides a testing method for a semiconductor element, which includes following steps. A level of a testing electrostatic discharge (ESD) voltage is determined. A plurality of first sample components is provided. The testing ESD voltage is imposed on the first sample components for testing ESD decay rates of the first sample components. ESD withstand voltages of the first sample components are detected. A relation between the ESD withstand voltages and the ESD decay rates are recorded in a database. The testing ESD voltage is imposed on the semiconductor element for testing an ESD decay rate of the semiconductor element. The database is looked up to determine an ESD withstand voltage of the semiconductor element according to the ESD decay rate of the semiconductor element.

An embodiment of the disclosure provides a testing method for a semiconductor element, which includes following steps. A level of a testing electrostatic discharge (ESD) voltage is determined. A plurality of first sample components is provided. Before the testing ESD voltage is imposed on the first sample components, a plurality of first basic characteristic values of the first sample components corresponding to the testing ESD voltage is measured. The testing ESD voltage is imposed on the first sample components. After the testing ESD voltage is imposed on the first sample components, a plurality of second basic characteristic values of the first sample components corresponding to the testing ESD voltage is measured. Basic characteristic offsets of the first sample components corresponding to the testing ESD voltage are obtained according to differences between the first basic characteristic values and the second basic characteristic values. ESD withstand voltages of the first sample components are detected. A relation between the ESD withstand voltages and the basic characteristic offsets are recorded in a database. A third basic characteristic value of the semiconductor element is measured. The testing ESD voltage is imposed on the semiconductor element. A fourth basic characteristic value of the semiconductor element is measured. A basic characteristic shift of the semiconductor element corresponding to the testing ESD voltage is obtained according to a difference between the third basic characteristic value and the fourth basic characteristic value. The database is looked up to determine an ESD withstand voltage of the semiconductor element according to the basic characteristic shift of the semiconductor element.

An embodiment of the disclosure provides a testing system for a semiconductor element, which is adapted to detect an ESD withstand voltage of the semiconductor element. The testing system for the semiconductor element includes an electrostatic generator, a current probe and a determination device. The electrostatic generator is selectively coupled to the semiconductor element, and imposes a testing ESD voltage on the semiconductor element. The current probe is selectively coupled to the semiconductor element, and detects an ESD decay rate of the semiconductor element after the electrostatic generator imposes the testing ESD voltage on the semiconductor element. The determination device is coupled to the current probe, and determines the ESD withstand voltage of the semiconductor element according to the ESD decay rate.

According to the above descriptions, in the disclosure, the ESD decay rate of the semiconductor element is detected, and/or a current-voltage characteristic variation of the semiconductor element before and after the ESD is detected to determine the ESD tolerance of the semiconductor element. During the testing process, since the testing ESD voltage is smaller than a breakdown voltage of the tested semiconductor element, the disclosure provides a non-destructive testing method for ESD tolerance, so as to implement comprehensive testing involving all the semiconductor elements on the ESD tolerance.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 10:
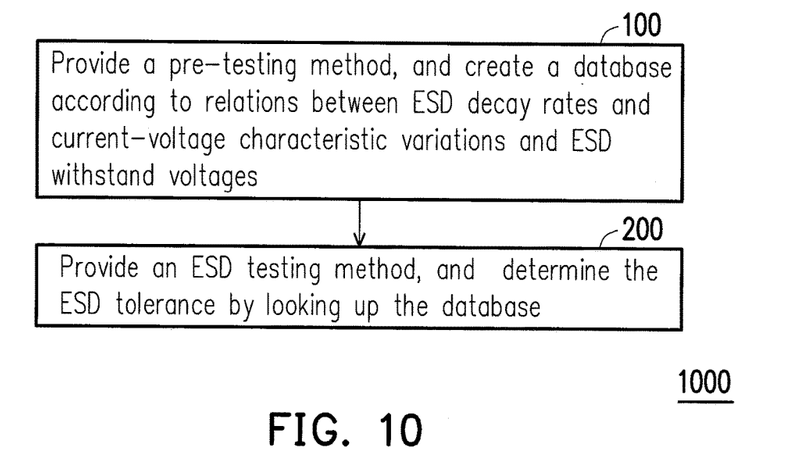
FIG. 10 is a flowchart illustrating a testing method for a semiconductor element according to an embodiment of the disclosure.

Referring to FIG. 10 first, FIG. 10 is a flowchart illustrating a testing method for a semiconductor element according to an embodiment of the disclosure. Referring to FIG. 10, a semiconductor electrostatic discharge (ESD) testing method 1000 mainly includes a pre-testing method 100 and a general testing method 200. In the pre-testing method 100, by detecting an ESD decay rate of the semiconductor element, and/or by detecting relations between a current-voltage characteristic variation and an ESD withstand voltage of the semiconductor element before and after the ESD, a plurality of batches of relation data is used to establish a database. The general testing method 200 is used to look up the database to determine the ESD withstand voltage of the semiconductor element. Steps of the pre-testing method 100 and the general testing method 200 are described in detail later.

Figure 1:
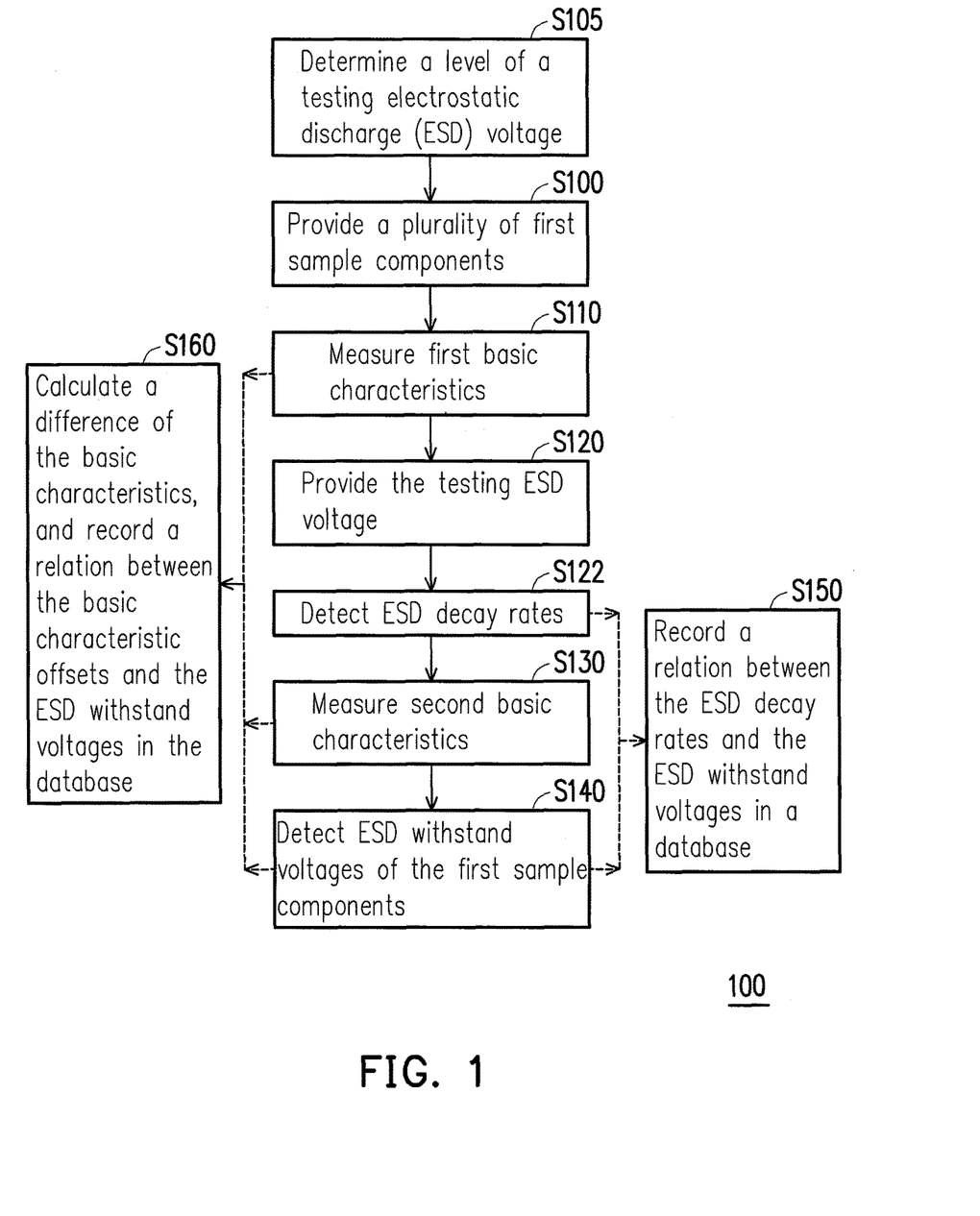
FIG. 1 is a flowchart illustrating an electrostatic discharge (ESD) pre-testing method for a semiconductor element of FIG. 10 according to an embodiment of the disclosure.

FIG. 1 is a flowchart illustrating an ESD pre-testing method for a semiconductor element of FIG. 10 according to an embodiment of the disclosure. Related descriptions of FIG. 10 can be referred for the embodiment of FIG. 1. First, a level of a testing ESD voltage is determined (step S105), where detailed steps of determining the ESD voltage are described later. Moreover, a plurality of first sample components required by the ESD pre-testing method 100 is provided. For example, if a plurality of light-emitting diode (LED) dies in a wafer is taken as the semiconductor elements to be tested, in the step S100, a part of the LED dies is selected to serve as the sample components of the pre-testing. Then, basic characteristics of the first sample components corresponding to the testing ESD voltage are respectively measured (step S110). In the present embodiment, the basic characteristic of the first sample component is a current-voltage characteristic thereof, for example, an I-V curve. Before the testing ESD voltage is imposed on the first sample components, the current-voltage characteristics of the first sample components are measured to obtain the first basic characteristic values. In the present embodiment, the testing system provides a predetermined voltage (for example, 3V or other working voltages) to the first sample components, and measures the corresponding current values (equivalent to the first basic characteristic values) of the first sample components. In other embodiments, the testing system provides a predetermined current (for example, 1 A or other working currents) to the first sample components, and measures the corresponding voltage values (equivalent to the first basic characteristic values) of the first sample components. If the basic characteristic (the current-voltage characteristic) does not reach a normal standard of the semiconductor element, the follow up flow is not continued.

After the basic characteristics of the first sample components are measured, the testing ESD voltage is imposed on the first sample components (step S120), and ESD decay rates of the first sample components are respectively detected (step S122), where the testing ESD voltage imposed on the first sample components is smaller than a breakdown voltage of the first sample components, such that in the step S120, failure or damage of the sample components is avoided. The method for detecting the ESD decay rate in the step S122 is not limited by the disclosure. For example, the step S122 can refer to related descriptions of detecting the ESD decay rate in FIG. 2A, FIG. 3 and FIG. 4 (which are described later).

After the first sample components are discharged, the basic characteristics of the first sample components are again measured, for example, the current-voltage characteristics (step S130). After the testing ESD voltage is imposed on the first sample components, the current-voltage characteristics of the first sample components are again measured to obtain second basic characteristic values. In the present embodiment, in the step S130, the testing system provides a predetermined voltage the same to that of the step S110 to the first sample components, and measures the corresponding current values (equivalent to the second basic characteristic values) of the first sample components. In other embodiments, the testing system provides a predetermined current the same to that of the step S110 to the first sample components, and measures the corresponding voltage values (equivalent to the second basic characteristic values) of the first sample components.

After the step S130 is completed, ESD withstand voltages of the first sample components are detected (step S140). In the step S140, the detecting system sequentially imposes a plurality of reverse ESD biases having different voltage levels to the first sample components in a sequence from low to high, and records current value variations of the first sample components to obtain the ESD withstand voltages of the first sample components. For example, the testing system can one-by-one impose ESD voltages of 500V, 1000V, 2000V, 3000V, 4000V and so on to the first sample components in a sequence from low to high, so as to detect the maximum ESD voltage (i.e. the ESD withstand voltage) endured by the first sample components.

In step S150, the testing system records a relation between the ESD decay rates of the step S122 and the ESD withstand voltages of the step S140 in a database. In step S160, the testing system calculates differences between the first basic characteristic values of the step S110 and the second basic characteristic values of the step S130, and obtains basic characteristic offsets of the first sample components corresponding to the testing ESD voltage according to the differences. In the step S160, the testing system further records a relation between the basic characteristic offsets and the ESD withstand voltages of the step S140 in the database. The pre-testing process is performed on a plurality of the sample components according to the above flow, so as to establish a plurality of batches of relation data in the database. The database can serve as a classification standard for determining the ESD tolerance in the follow up general testing method 200 (which is described later).

For example, the content of the database may include relation data such as "a sample component A having the ESD decay rate of SA and the ESD withstand voltage of VA", "a sample component B having the ESD decay rate of SB and the ESD withstand voltage of VB", etc. If it is detected in the general testing method 200 (which is described later) that the ESD decay rate of a certain semiconductor element is SA, the testing system can determine (predict) that the maximum ESD voltage (the ESD withstand voltage) endured by the semiconductor element is VA according to the database. If it is detected in the general testing method 200 (which is described later) that the ESD decay rate of another semiconductor element is between SA and SB, the testing system can determine (predict) that the maximum ESD voltage (the ESD withstand voltage) endured by the semiconductor element is between VA and VB according to the database, and accordingly obtain the ESD withstand voltage of the semiconductor element through an interpolation method.

For another example, the content of the database may include relation data such as "a sample component A having the basic characteristic shift of DA before and after the ESD and the ESD withstand voltage of VA", "a sample component B having the basic characteristic shift of DB before and after the ESD and the ESD withstand voltage of VB", etc. If it is detected in the general testing method 200 (which is described later) that the basic characteristic shift before and after the ESD of a certain semiconductor element is DA, the testing system can determine (predict) that the maximum ESD voltage (the ESD withstand voltage) endured by the semiconductor element is VA according to the database. If it is detected in the general testing method 200 (which is described later) that the basic characteristic shift before and after the ESD of another semiconductor element is between DA and DB, the testing system can determine (predict) that the maximum ESD voltage (the ESD withstand voltage) endured by the semiconductor element is between VA and VB according to the database, and accordingly obtain the ESD withstand voltage of the semiconductor element through an interpolation method.

It should be noticed that the aforementioned two methods can be simultaneously used or one of the two methods can be used to serve as a standard for determining the ESD tolerance. In some embodiments, if only the database established in the step S150 is used, the steps S110, S130 and S160 in FIG. 1 can be omitted, but it's not limited. In some other embodiments, if only the database established in the step S160 is used, the steps S122 and S150 in FIG. 1 can be omitted, but it's not limited.

Figure 2A:
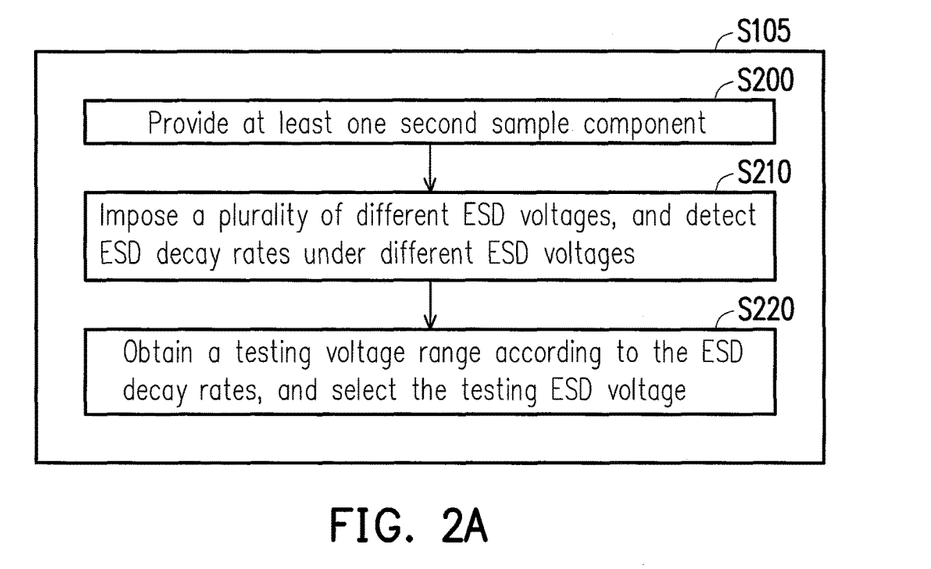
FIG. 2A is a flowchart illustrating a method for determining a level of a testing ESD voltage in a step S105 according to an embodiment of the disclosure.

It should be noticed that a method for determining the level of the testing ESD voltage imposed on the first sample components includes the steps shown in FIG. 2A, by which the level of the testing ESD voltage is obtained or determined. FIG. 2A is a flowchart illustrating a method for determining the level of the testing ESD voltage in the step S105 of FIG. 1 according to an embodiment of the disclosure. Referring to FIG. 2A, first, at least one second sample component is provided (step S200). For example, if a plurality of LED dies in a wafer is taken as the semiconductor elements to be tested, in the step S200, a part of the LED dies is selected to serve as the second sample components. Then, a plurality of different ESD voltages is imposed on the second sample components, and different ESD decay rates of the second sample components under different ESD voltages are respectively detected/recorded (step S210), where the ESD decay rate of the sample component can be obtained by observing a discharge curve of the sample component after the ESD voltage is imposed.

Figure 3:
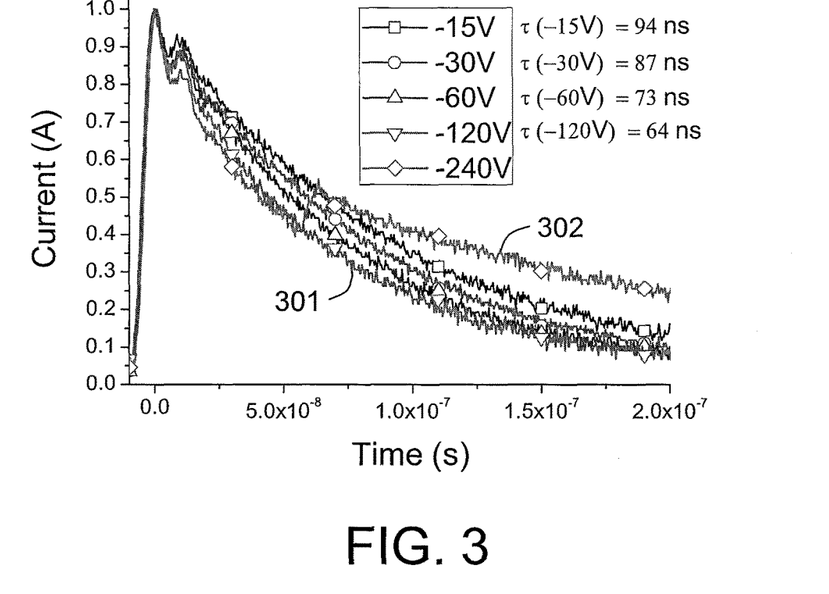
FIG. 3 is a diagram illustrating discharge curves of a sample component under different ESD voltages.

FIG. 3 is a diagram illustrating discharge curves of a same sample component under different ESD voltages. As shown in FIG. 3, a horizontal axis represents time (second), and a vertical axis represents ESD current. A plurality of different ESD voltages is imposed to obtain different discharge curves. For example, when the ESD voltage is −15V, a corresponding discharge curve 301 is obtained, and when the ESD voltage is −240V, a corresponding discharge curve 302 is obtained. In the present embodiment, a curve equation $y=y0+\exp(-\tau/t)$ is used to fit the discharge curves, where y is an ESD current of the semiconductor element (the second sample component), y0 is a constant, exp( ) is a natural logarithm function, $\tau$ is a recession constant (or referred to as a time constant), and t is time. Therefore, the discharge curve can be converted through the curve equation to obtain the recession constant $\tau$, and the recession constant $\tau$ can be taken as the ESD decay rate of the sample component. Taking the ESD voltage of −15V as an example, after the discharge curve 301 is converted through the curve equation $y=y0+\exp(-\tau/t)$, the recession constant $\tau(-15V)=94$ ns thereof is obtained. The other discharge curves can be deduced by analogy.

However, by observing the discharge curves of FIG. 3, it is discovered that as the ESD voltage imposed on the sample component is gradually increased to exceed a certain value, the discharge curve thereof is not obviously changed (i.e. the recession constants $\tau$ are almost the same). For example, it is assumed that when the ESD voltage is greater than −240V, the discharge curves of different ESD voltages have little difference there between, and the ESD voltage greater than −240V is not suitable to be used to test the semiconductor element. In this way, according to the above feature, it can be deduced that when the range of the ESD voltage exceeds a certain value, the ESD decay rate thereof does not have a reference value.

Figure 4:
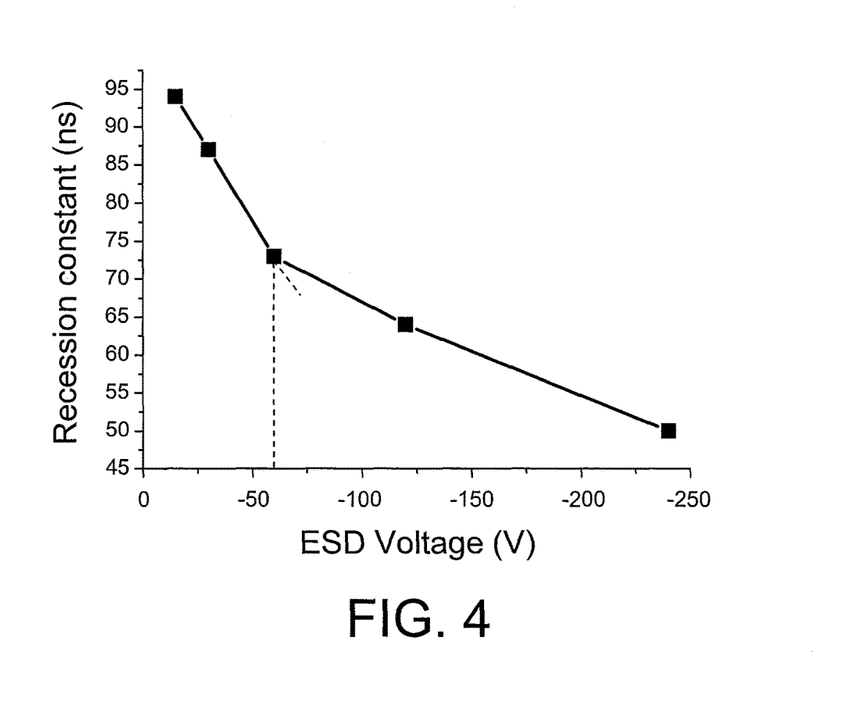
FIG. 4 is a diagram illustrating a recession constant curve corresponding to different ESD voltages of FIG. 3.

FIG. 4 is a diagram illustrating a recession constant curve corresponding to different ESD voltages of FIG. 3. In FIG. 4, the horizontal axis represents the ESD voltage (volt), and the vertical axis represents the recession constant (nanosecond, ns). Referring to FIG. 3 and FIG. 4, when the ESD voltages imposed on the sample component is −15V, −30V, −60V, −120V and −240V, the corresponding recession constants $\tau$ thereof are respectively 94 ns, 87 ns, 73 ns, 64 ns and 50 ns. According to FIG. 4, it is known that the higher the ESD voltage imposed on the sample component is, the smaller an absolute value of a slope of the corresponding recession constant curve is. Referring to FIG. 2A, in step S220, a testing voltage range is obtained according to the ESD decay rates (the recession constants $\tau$) obtained in the step S210, where the testing voltage range is not greater than a breakdown voltage of the second sample component. After the testing voltage range is determined in the step S220, the level of the testing ESD voltage of the step S120 in FIG. 1 is selected/determined according to the testing voltage range. For example, according to the variation of the recession constants of FIG. 4, it is discovered that when the ESD voltage approximately exceeds −60V, a slope variation of the recession constant curve relative to the horizontal axis is significantly flattened. According to the above feature, the testing voltage range in the step S220 of FIG. 2A is deduced to be 0~−60V. Therefore, in the step S220 of FIG. 2A, a large voltage value that is not greater than the breakdown voltage of the sample component is selected from the testing voltage range 0~−60V to serve as the level of the testing ESD voltage.

Figure 2B:
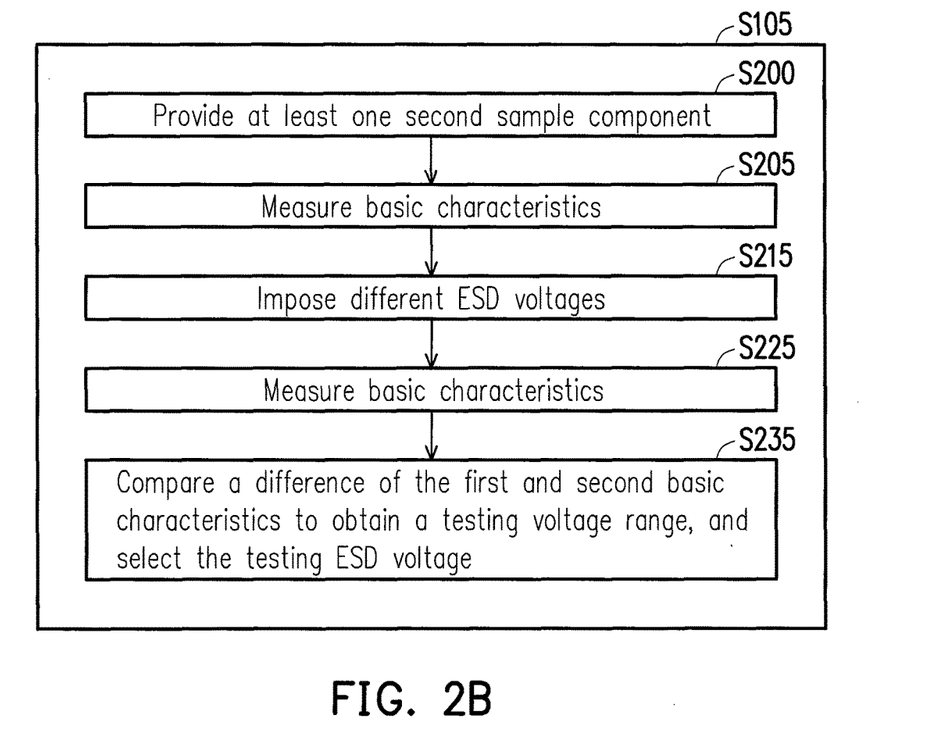
FIG. 2B is a flowchart illustrating a method for determining a level of a testing ESD voltage in a step S105 according to another embodiment of the disclosure.

However, the method for determining the level of the testing ESD voltage in the step S105 of FIG. 1 is not limited to the example of FIG. 2A. For example, FIG. 2B is a flowchart illustrating a method for determining the level of the testing ESD voltage in the step S105 of FIG. 1 according to another embodiment of the disclosure. Referring to FIG. 2B, first, at least one second sample component is provided (step S200). Then, before a step of imposing different ESD voltages on the second sample components (step S215), basic characteristics of the second sample components corresponding to the ESD voltages are measured to obtain a plurality of basic characteristic values (step S205), where the basic characteristics are the current-voltage characteristics of the sample components in the present embodiment. Then, after the step of imposing different ESD voltages on the second sample components (step S215), basic characteristics of the second sample components corresponding to the ESD voltages are measured to obtain a plurality of basic characteristic values (step S225). The step S205 and the step S225 can be deduced according to related descriptions of the steps S110 and S130 of FIG. 1. According to the basic characteristic values obtained in the step S205 and the basic characteristic values obtained in the step S225, in step S235, a testing voltage range can be determined according to differences between the basic characteristic values obtained before the ESD voltages are imposed and the basic characteristic values obtained after the ESD voltages are imposed, and the level of the testing ESD voltage in the step S120 of FIG. 1 is selected from the testing voltage range.

In the present embodiment, the testing system provides a predetermined voltage (for example, 3V or other working voltages) to the second sample components, and measures to obtain current values of the second sample components to serve as the basic characteristic values. In other embodiments, the testing system provides a predetermined current (for example, 1 A or other working currents) to the second sample components, and measures to obtain voltage values of the second sample components to serve as the basic characteristic values. For example, the basic characteristics of the second sample components are measured to obtain basic characteristic values Eb(−15V) before the ESD voltage −15V is imposed on the second sample components, and the basic characteristics of the second sample components are measured to obtain basic characteristic values Ea(−15V) after the ESD voltage −15V is imposed on the second sample components, and the difference obtained in the step S235 is [Ea(−15V)−Eb(−15V)]. The basic characteristics of the second sample components are measured to obtain basic characteristic values Eb(−30V) before the ESD voltage −30V is imposed on the second sample components, and the basic characteristics of the second sample components are measured to obtain basic characteristic values Ea(−30V) after the ESD voltage −30V is imposed on the second sample components, and the difference obtained in the step S235 is [Ea(−30V)−Eb(−30V)]. Deduced by analogy, the basic characteristic values obtained by measuring the basic characteristics of the second sample components before and after the ESD voltages −60V, −120V and −240V are imposed on the second sample components are Eb(−60V), Eb(−120V), Eb(−240V) and Ea(−60V), Ea(−120V), Ea(−240V), and the differences therebetween are respectively [Ea(−60V)−Eb(−60V)], [Ea(−120V)−Eb (−120V)], [Ea(−240V)−Eb(−240V)].

In the present embodiment, the testing system provides the predetermined voltage (for example, 3V or other working voltages) to the second sample components, and measures to obtain current values of the second sample components to serve as the basic characteristic values, and in the step S235 of FIG. 2B, a plurality of differences (for example, current offsets) is obtained according to different ESD voltages. A basic characteristic value shift curve corresponding to the different ESD voltages can be obtained according to the differences obtained in the step S235. If the difference is the current offset, the basic characteristic value shift curve can be a current shift curve. In other embodiments, if the difference is a voltage offset, the basic characteristic value shift curve can be a voltage shift curve.

Figure 5:
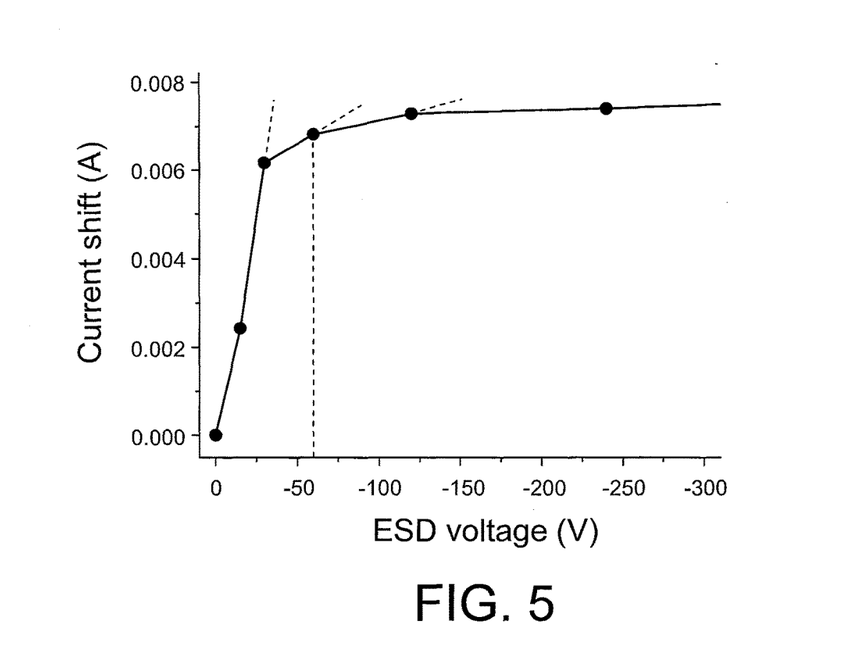
FIG. 5 is a diagram illustrating a current shift corresponding to different ESD voltages of FIG. 3.

According to the basic characteristic value shift curve, the step S235 of FIG. 2B can determine a testing voltage range, where the testing voltage range is not greater than the breakdown voltage of the second sample component. For example, FIG. 5 is a diagram illustrating a current shift corresponding to different ESD voltages of FIG. 3. A horizontal axis of FIG. 5 represents ESD voltages, and a vertical axis represents current offsets. The current shift is obtained by comparing the basic characteristic values before and after the ESD voltage is imposed. When the ESD voltage imposed on the sample component is increased, the current shift of the sample component before and after the ESD voltage is imposed is also increased. However, according to the variation of the current offsets shown in FIG. 5, it is discovered that when the ESD voltage is approximately greater than −60V, a slope of the current shift curve relative to the horizontal axis is gradually flattened. In this way, according to the above feature, the testing voltage range in the step S235 of FIG. 2B is deduced to be 0V to −60V. Therefore, in the step S235 of FIG. 2B, a large voltage value that is not greater than the breakdown voltage of the sample component is selected from the testing voltage range of 0V to −60V to serve as the level of the testing ESD voltage.

The range of the testing ESD voltage can be obtained according to the method shown in FIG. 2A and/or FIG. 2B, and a suitable level of the testing ESD voltage is selected from such range, so as to impose the testing ESD voltage on the sample components in the step S120 of FIG. 1.

Figure 6:
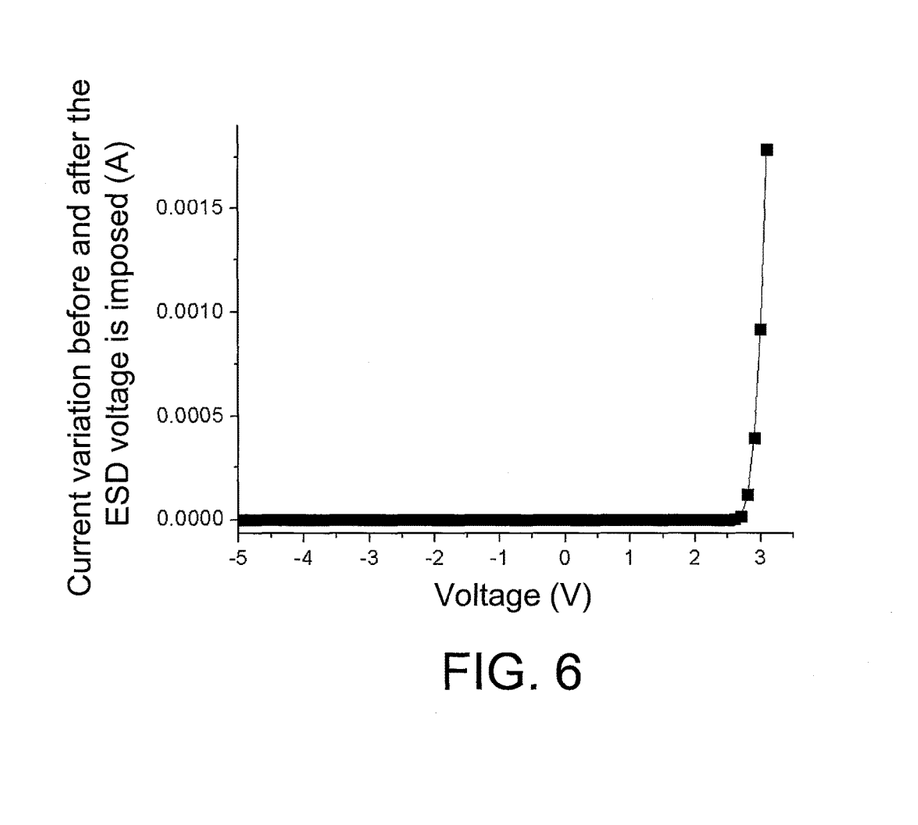
FIG. 6 is a diagram illustrating a current-voltage characteristic shift curve before and after an ESD voltage is imposed on a semiconductor element according to an embodiment of the disclosure.

FIG. 6 is a characteristic curve diagram of current variation (offset) and working voltages of the semiconductor element before and after the ESD voltage is imposed. It is assumed that a working current of the semiconductor element before the ESD voltage is imposed is Ib, and a working current of the semiconductor element after the ESD voltage is imposed is Ia, where the level of the ESD voltage can be any voltage level smaller than the breakdown voltage of the semiconductor element. In other embodiments, the level of the ESD voltage can be determined according to the method of FIG. 2A and/or FIG. 2B. Referring to FIG. 6, the horizontal axis represents the working voltages (volt) supplied to the semiconductor element to be tested, and the vertical axis represents a current variation (Ia-Ib) (ampere) of the semiconductor element before and after the ESD voltage is imposed. According to FIG. 6, it is discovered that when the working voltage supplied to the semiconductor element to be tested is smaller than about 2.6V, the current variation (Ia-Ib) of the semiconductor element is almost 0. When the working voltage supplied to the semiconductor element to be tested is greater than about 2.6V, the influence of the ESD voltage on the current variation (Ia-Ib) of the semiconductor element is more obvious as the working voltage increases. Therefore, the testing system can select the level of the working voltage (for example, 3V) in the range greater than about 2.6V to serve as the predetermined voltage (or working voltage) in the steps S110 and S130 of FIG. 1. In other embodiments, the predetermined voltage (or working voltage) in the steps S205 and S225 of FIG. 2B that are used for measuring the basic characteristic can also be determined by referring to related descriptions of FIG. 6.

Figure 7:
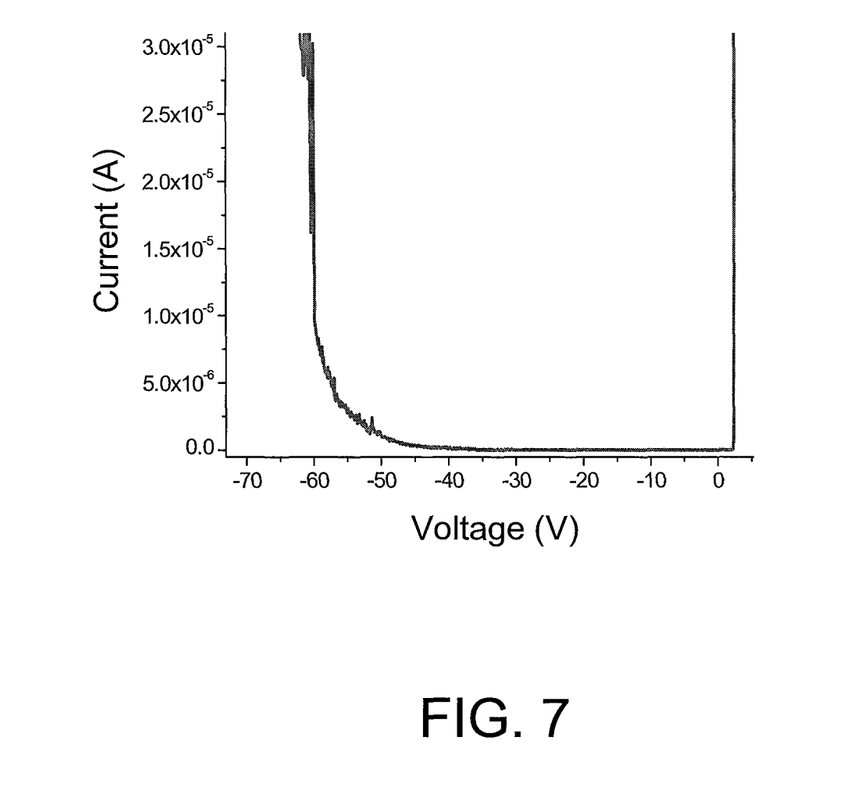
FIG. 7 is a schematic diagram of a current-voltage curve of a semiconductor element according to an embodiment of the disclosure.

FIG. 7 is a schematic diagram of a current-voltage curve of the semiconductor element according to an embodiment of the disclosure. The method of detecting the breakdown voltage of the first sample component in the step S140 of FIG. 1 can be deduced by referring to related descriptions of FIG. 7. Referring to FIG. 7, an LED die is taken as the semiconductor element to be tested (the sample component). When the voltage is greater than about 2.3V, where the sample component is operating in the forward state, a large current flows through the semiconductor element. When a reverse bias (a negative voltage) is imposed on the sample component, the sample component is not conducted. However, when the reverse bias exceeds the breakdown voltage (for example, about −60V in FIG. 7) of the sample component, with the breakdown of the sample component, a large current flows through the sample component. Therefore, the testing system can determine that the breakdown voltage of the sample component is about −60V. As the breakdown voltage of the sample component has been detected, the other semiconductor elements in the same wafer with that of the sample component and the other semiconductor elements having a fabrication process the same with that of the sample component all have the same or similar breakdown voltage.

Figure 8:
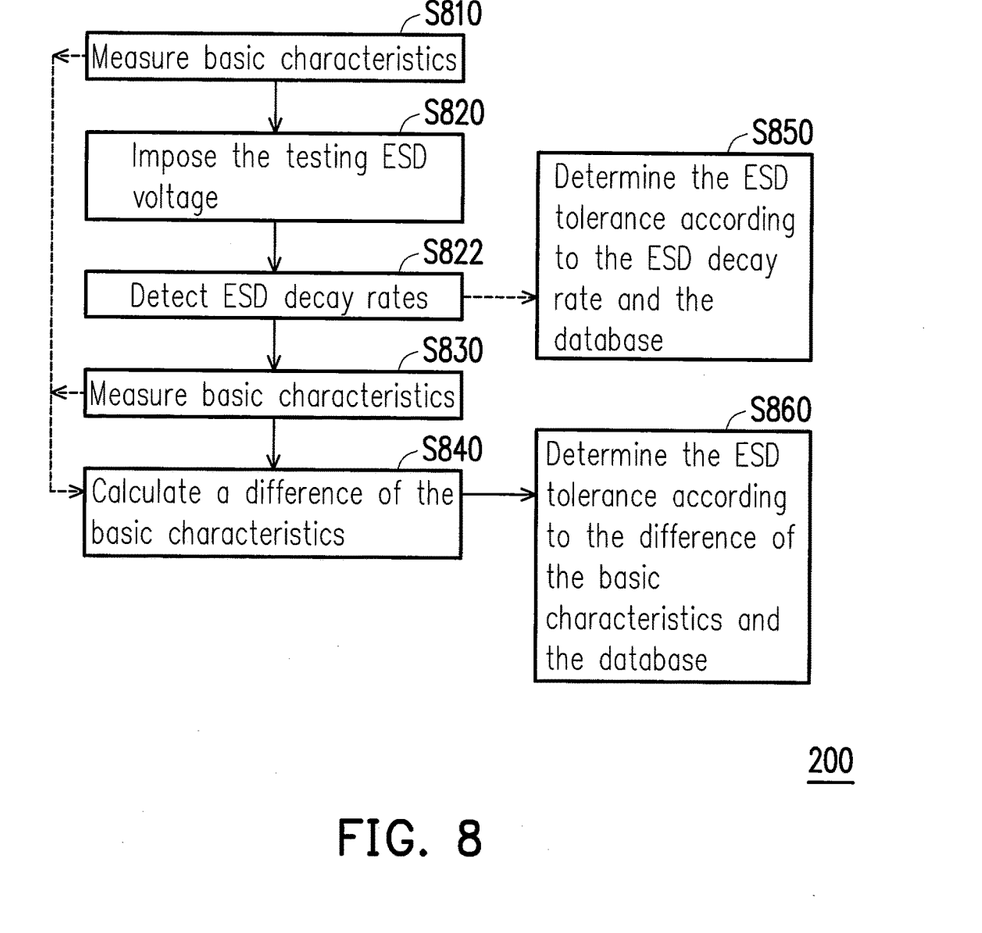
FIG. 8 is a flowchart illustrating a general ESD testing method for a semiconductor element of FIG. 10 according to an embodiment of the disclosure.

FIG. 8 is a flowchart illustrating a general ESD testing method 200 for the semiconductor element of FIG. 10 according to an embodiment of the disclosure. The related descriptions of FIG. 1 and FIG. 10 can be referred for the embodiment of FIG. 8. First, one of the semiconductor elements to be tested is selected. For example, if a plurality of light-emitting diode (LED) dies in a wafer is taken as the semiconductor elements to be tested, the ESD testing flow of FIG. 8 can be performed on each of the LED dies. Then, before the testing ESD voltage is imposed on the semiconductor element (step S820), a basic characteristic (for example, a current-voltage characteristic) of the semiconductor element is measured to obtain a basic characteristic value (step S810). The step S810 of FIG. 1 can be deduced by referring to the related descriptions of the step S110 of FIG. 1.

Then, after the basic characteristic of the semiconductor element is measured (step S810), the testing ESD voltage is imposed on the semiconductor element (step S820), and an ESD decay rate of the semiconductor element is tested (step S822), where the level of the applied ESD voltage in the step S820 is determined by referring to related descriptions of FIG. 2A and/or FIG. 2B. The related descriptions for testing the ESD decay rate in FIG. 2A, FIG. 3 and FIG. 4 can be referred for the step S822. Following the discharging process of the semiconductor element, the basic characteristic of the semiconductor element is measured to obtain a basic characteristic value after the testing ESD voltage is imposed (step S830). The basic characteristic value obtained before the testing ESD voltage is imposed and the basic characteristic value obtained after the testing ESD voltage is imposed are respectively the current values obtained by measuring the semiconductor element when a predetermined voltage (for example, 3V or other working voltages) is applied. In other embodiments, the basic characteristic value obtained before the testing ESD voltage is imposed and the basic characteristic value obtained after the testing ESD voltage is imposed are respectively the voltage values obtained by measuring the semiconductor element when a predetermined current (for example, 1 A or other working currents) is applied. The steps S820, S822 and S830 can be deduced by referring to related descriptions of the steps S120, S122 and S130 of FIG. 1.

In step S850, according to the ESD decay rate (for example, the recession constant τ) of the step S822, the database provided according to the pre-testing method 100 of FIG. 1 is looked up to determine a tolerance of the semiconductor element for the ESD voltage (i.e. an ESD withstand voltage). The database records a relation between the ESD withstand voltage of the semiconductor element and the ESD decay rate of the semiconductor element. For example, the content of the database may include relation data such as "a sample component A having the ESD decay rate of SA and the ESD withstand voltage of VA", "a sample component B having the ESD decay rate of SB and the ESD withstand voltage of VB", etc. If it is detected in the step S822 that the ESD decay rate of the semiconductor element is SA, the testing system can determine (predict) that the maximum ESD voltage (the ESD withstand voltage) endured by the semiconductor element is VA according to the database in step S850. If it is detected in the step S822 that the ESD decay rate of the semiconductor element is between SA and SB, the testing system can determine (predict) that the maximum ESD voltage (the ESD withstand voltage) endured by the semiconductor element is between VA and VB according to the database in the step S850, and accordingly obtain the ESD withstand voltage of the semiconductor element through an interpolation method. Therefore, in the step S850, the testing system can determine the tolerance of the semiconductor element for the ESD voltage according to the database and the ESD decay rate of the semiconductor element.

In step S840, the testing system compares/calculates a difference between the basic characteristic value obtained in the step S810 and the basic characteristic value obtained in the step S830 to obtain a basic characteristic shift of the semiconductor element corresponding to the testing ESD voltage. The step S840 of FIG. 8 can be deduced by referring to related descriptions of the step S160 of FIG. 1.

In step S860, according to the basic characteristic shift obtained in the step S840, the database provided according to the pre-testing method 100 of FIG. 1 is looked up to determine a tolerance of the semiconductor element for the ESD voltage (i.e. an ESD withstand voltage). For example, the content of the database may include relation data such as "a sample component A having the basic characteristic shift DA before and after the ESD and the ESD withstand voltage VA", "a sample component B having the basic characteristic shift DB before and after the ESD and the ESD withstand voltage VB", etc. If it is detected in the step S840 that the basic characteristic shift of the semiconductor element is DA, the testing system can determine (predict) that the maximum ESD voltage (the ESD withstand voltage) endured by the semiconductor element is VA according to the database in step S860. If it is detected in the step S840 that the basic characteristic shift of the semiconductor element is between SA and SB, the testing system can determine (predict) that the maximum ESD voltage (the ESD withstand voltage) endured by the semiconductor element is between VA and VB according to the database in the step S860, and accordingly obtain the ESD withstand voltage of the semiconductor element through the interpolation method. Therefore, in the step S860, the testing system can determine the tolerance of the semiconductor element for the ESD voltage according to the database and the basic characteristic shift of the semiconductor element.

It should be noticed that the above two methods can be simultaneously used or one of the two methods can be used to determine the ESD tolerance of the semiconductor element to be tested. In some embodiments, if only the step S850 is used to determine the ESD tolerance of the semiconductor element, the steps S810, S830, S840 and S860 in FIG. 8 can be omitted, but it isn't limited. In some other embodiments, if only the step S860 is used to determine the ESD tolerance of the semiconductor element, the steps S822 and S850 in FIG. 8 can be omitted, but it isn't limited.

Figure 9:
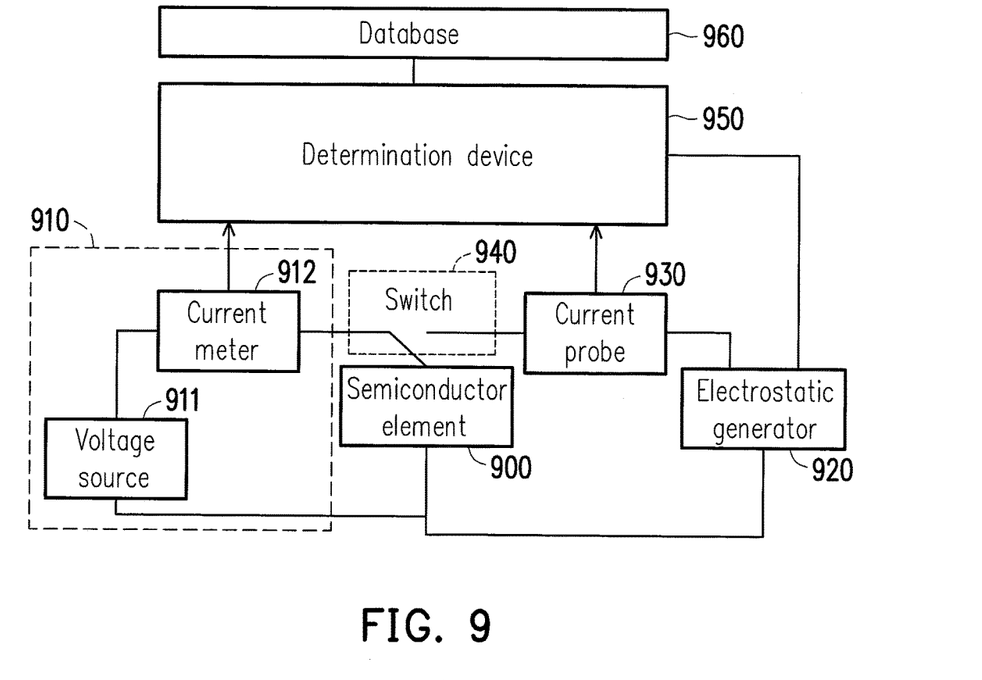
FIG. 9 is a circuit block diagram of a testing system for a semiconductor element according to an embodiment of the disclosure.

FIG. 9 is a circuit block diagram of a testing system for a semiconductor element according to an embodiment of the disclosure. Related descriptions of FIG. 1 and FIG. 8 can be referred for the embodiment of FIG. 9. Referring to FIG. 9, the testing system for a semiconductor element includes a source measurement unit 910, an electrostatic generator 920, a current probe 930, a switch 940, a determination device 950 and a database 960. The semiconductor element 900 to be tested is selectively coupled to the source measurement unit 910 or the current probe 930 through the switch 940. The source measurement unit 910, the current probe 930 and the electrostatic generator 920 are coupled to the determination device 950. The determination device 950 is coupled to the database 960. The database 960 stores the content of the database generated in the pre-testing method 100 of FIG. 1. Namely, the database 960 records a relation between the ESD withstand voltages and the basic characteristic offsets, and/or records a relation between the ESD withstand voltages and the ESD decay rates.

If the database 960 records the relation between the ESD withstand voltages and the ESD decay rates, the determination device 950 can look the relation up in the database 960 according to the ESD decay rate of the semiconductor element 900 to determine the ESD withstand voltage of the semiconductor element 900. If the database 960 records the relation between the ESD withstand voltages and the basic characteristic offsets, the determination device 950 can look the relation up in the database 960 according to the basic characteristic shift of the semiconductor element 900 to determine the ESD withstand voltage of the semiconductor element 900.

Before the testing ESD voltage is imposed on the semiconductor element 900, the source measurement unit 910 measures and outputs a current-voltage characteristic of the semiconductor element 900 to the determination device 950. After the testing ESD voltage is imposed on the semiconductor element 900, the source measurement unit 910 again measures and outputs the current-voltage characteristic of the semiconductor element 900 to the determination device 950. The determination device 950 obtains the basic characteristic shift of the semiconductor element 900 corresponding to the test ESD voltage according to a difference between the basic characteristic values before and after the testing ESD voltage is imposed.

In the present embodiment, the source measurement unit 910 includes a voltage source 911 and a current meter 912, where the voltage source 911 is connected in series with the current meter 912. The voltage source 911 may provide a testing working voltage to the semiconductor element 900 to be tested, and the current meter 912 can measure a working current of the semiconductor element 900. Therefore, when the semiconductor element 900 is coupled to the source measurement unit 910 through the switch 940, the determination device 950 can measure a current value of the semiconductor element 900 through the current meter 912. In other embodiments, the source measurement unit 910 may include a current source and a voltmeter, where the current source is connected in series with the voltmeter. The current source may provide a testing working voltage to the semiconductor element 900 to be tested, and the voltmeter can measure a working voltage of the semiconductor element 900. Therefore, when the semiconductor element 900 is coupled to the source measurement unit 910 through the switch 940, the determination device 950 can measure a voltage value of the semiconductor element 900 through the voltmeter. Therefore, the determination device 950 can measure the basic characteristic (the current-voltage characteristic) of the semiconductor element 900 through the source measurement unit 910.

In the present embodiment, if the semiconductor element 900 is used to implement the pre-testing method 100 of FIG. 1, the testing system can implement the ESD pre-testing through following operations. Referring to FIG. 1 and FIG. 9, first, the switch 940 is switched to the source measurement unit 910, such that the source measurement unit 910 is coupled to the semiconductor element 900. Now, the source measurement unit 910 measures a basic characteristic (for example, the current-voltage characteristic) of the semiconductor element 900, and outputs the basic characteristic (for example, the current-voltage characteristic) of the semiconductor element 900 to the determination device 950. A detailed operation process thereof can refer to the related description of the step S110 of FIG. 1.

Then, the switch 940 is switched to the electrostatic generator 920 and the current probe 930, such that the electrostatic generator 920 is selectively coupled to the semiconductor element 900. Now, the electrostatic generator 920 imposes the testing ESD voltage on the semiconductor element 900, and the current probe 930 detects an ESD current of the semiconductor element 900 and outputs a detecting result to the determination device 950. Therefore, the determination device 950 can calculate an ESD decay rate (for example, the recession constant $\tau$) of the semiconductor element 900 according to the detecting result of the current probe 930. In other embodiments, after the electrostatic generator 920 imposes the testing ESD voltage on the semiconductor element 900, the current probe 930 can detect the ESD decay rate of the semiconductor element 900, and outputs the detecting result to the determination device 950. A detailed operation process thereof can refer to the related description of the steps S120 and S122 of FIG. 1.

Then, the switch 940 is again switched to the source measurement unit 910, such that the source measurement unit 910 is coupled to the semiconductor element 900. Now, the source measurement unit 910 again measures the basic characteristic of the semiconductor element 900, and outputs the basic characteristic (for example, a current value or a voltage value) of the semiconductor element 900 to the determination device 950. A detailed operation process thereof can refer to the related description of the step S130 of FIG. 1.

Then, the switch 940 is again switched to the electrostatic generator 920 and the current probe 930, such that the electrostatic generator 920 is coupled to the semiconductor element 900. Now, the determination device 950 controls the electrostatic generator 920 to gradually increase the testing ESD voltage imposed on the semiconductor element 900, and monitors whether the semiconductor element 900 is failed through the current probe 930, so as to detect the ESD withstand voltage of the semiconductor element 900. A detailed operation process thereof can refer to the related description of the step S140 of FIG. 1.

After the determination device 950 obtains the ESD decay rate and the ESD withstand voltage of the semiconductor element 900, the determination device 950 can execute the step S150 of FIG. 1 to record the relation between the ESD decay rate and the ESD withstand voltage of the semiconductor element 900 in the database 960. Alternatively, after the determination device 950 obtains the difference between the basic characteristic values of the semiconductor element 900 before and after the testing ESD voltage is imposed, the determination device 950 can execute the step S160 of FIG. 1 to record the relation between the basic characteristic shift and the ESD withstand voltage of the semiconductor element 900 in the database 960.

In the embodiment of FIG. 9, if the semiconductor element 900 is used to implement the general testing method 200 of FIG. 8, the testing system can implement the ESD testing through following operations. Referring to FIG. 8 and FIG. 9, first, the switch 940 is switched to the source measurement unit 910, such that the source measurement unit 910 is coupled to the semiconductor element 900. Now, the source measurement unit 910 measures a basic characteristic (for example, the current-voltage characteristic) of the semiconductor element 900, and outputs the basic characteristic (for example, the current-voltage characteristic) of the semiconductor element 900 to the determination device 950. A detailed operation process thereof can refer to the related description of the step S810 of FIG. 8.

Then, the switch 940 is switched to the electrostatic generator 920 and the current probe 930, such that the electrostatic generator 920 is coupled to the semiconductor element 900. Now, the electrostatic generator 920 imposes the testing ESD voltage on the semiconductor element 900, and the current probe 930 detects an ESD current of the semiconductor element 900 and outputs a detecting result to the determination device 950. The determination device 950 can calculate an ESD decay rate (for example, the recession constant τ) of the semiconductor element 900 according to the detecting result of the current probe 930. A detailed operation process thereof can refer to the related description of the steps S820 and S822 of FIG. 8.

Then, the switch 940 is again switched to the source measurement unit 910, such that the source measurement unit 910 is coupled to the semiconductor element 900. Now, the source measurement unit 910 again measures the basic characteristic of the semiconductor element 900, and outputs the basic characteristic (for example, a current value or a voltage value) of the semiconductor element 900 to the determination device 950. A detailed operation process thereof can refer to the related description of the step S830 of FIG. 8.

Finally, the determination device 950 looks up the relation between the ESD withstand voltage and the ESD decay rate recorded in the database 960 according to the ESD decay rate of the semiconductor element 900, so as to determine the ESD tolerance (the ESD withstand voltage) of the semiconductor element 900. A detailed operation process thereof can refer to the related description of the step S850 of FIG. 8. Similarly, the determination device 950 can also look up the relation between the ESD withstand voltage and the basic characteristic shift recorded in the database 960 according to a difference between a first basic characteristic and a second basic characteristic of the semiconductor element 900, so as to determine the ESD tolerance of the semiconductor element 900. A detailed operation process thereof can refer to the related description of the step S860 of FIG. 8. The above two methods (i.e. the steps S850 and S860) can be simultaneously executed or one of the two methods can be executed to determine the ESD tolerance of the semiconductor element 900.

In summary, embodiments of the disclosure provides a non-destructive testing method for the ESD tolerance, through which a comprehensive ESD testing can be executed on a plurality of semiconductor elements to serve as a basis on ESD tolerance grading, so as to achieve a purpose of grading the manufactured products, which may greatly improve reliability of the products and a benefit of price differentiation.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A testing method for a semiconductor die, comprising:
   determining, by a determination device, a level of a testing electrostatic discharge (ESD) voltage output from an electrostatic generator circuit;
   imposing, by the electrostatic generator circuit, the testing ESD voltage on a plurality of first sample dies for testing ESD decay rates of the first sample dies;
   detecting ESD withstand voltage and a breakdown voltage of each of the first sample dies by the electrostatic generator circuit by sequentially imposing a plurality of reverse ESD biases having different voltage levels to the first sample dies;
   recording, by the determination device, a relation between the ESD withstand voltage, and a breakdown voltage and the ESD decay rate of each of the first sample dies into a database;
   imposing, by the electrostatic generator circuit, the testing ESD voltage on the semiconductor die for detecting an ESD decay rate of the semiconductor die, wherein the testing ESD voltage is lower than an ESD withstand voltage of the semiconductor die; and
   determining, by the determination device, an ESD withstand voltage and a breakdown voltage of the semiconductor die by matching the detected ESD decay rate of the semiconductor die to the detected ESD decay rate of the first sample dies recorded in the databases without imposing the reverse ESD biases to the semiconductor dies, wherein the semiconductor die and the first sample dies are different and fabricated by the same fabrication process.

2. The testing method for the semiconductor die as claimed in claim 1, wherein the step of detecting the ESD withstand voltages of the first sample dies comprises:
   sequentially imposing, by the electrostatic generator circuit, a plurality of reverse ESD biases having different voltage levels to the first sample dies in a sequence from low to high, and recording current value variations of the first sample dies to obtain the ESD withstand voltages of the first sample dies.

3. The testing method for the semiconductor die as claimed in claim 1, wherein the step of determining the level of the testing ESD voltage comprises:
   imposing a plurality of different ESD voltages on at least one second sample die by the electrostatic generator circuit;

respectively detecting, by a current probe circuit, a plurality of ESD decay rates of the at least one second sample die under the different ESD voltages;

determining a testing voltage range according to the ESD decay rates of the at least one second sample die by the determination device, wherein the testing voltage range is not greater than a breakdown voltage of the at least one second sample die; and selecting the level of the testing ESD voltage from the testing voltage range by the determination device.

4. The testing method for the semiconductor die as claimed in claim 1, wherein the ESD decay rate is a recession constant of a discharge curve equation, and the discharge curve equation $y=y0+\exp(-\tau/t)$ is used to fit a discharge curve obtained by imposing the testing ESD voltage, wherein y is an ESD current of the semiconductor die, y0 is a constant, exp( ) is a natural logarithm function, τ is the recession constant, and t is time.

5. A testing system for a semiconductor die, adapted to detect an electrostatic discharge (ESD) withstand voltage of the semiconductor die, comprises:

an electrostatic generator circuit, selectively coupled to the semiconductor die, and imposing a testing ESD voltage on the semiconductor die;

a current probe circuit, selectively coupled to the semiconductor element, and detecting an ESD decay rate of the semiconductor die after the electrostatic generator circuit imposes the testing ESD voltage on the semiconductor die; and a determination device, coupled to the current probe circuit, and determining the ESD withstand voltage and a breakdown voltage of the semiconductor die by referring the detected ESD decay rate to a database recording a relationship between an ESD decay rate, an ESD withstand voltage, and a breakdown voltage of a sample die without imposing a reverse ESD biases to the semiconductor die.

6. The testing system for the semiconductor die as claimed in claim 5, wherein the ESD decay rate is a recession constant of a discharge curve equation, and the discharge curve equation $y=y0+\exp(-\tau/t)$ is used to fit a discharge curve obtained by imposing the testing ESD voltage, wherein y is an ESD current of the semiconductor die, y0 is a constant, exp( ) is a natural logarithm function, τ is the recession constant, and t is time.

7. The testing system for the semiconductor die as claimed in claim 5, further comprising:

a database, coupled to the determination device, wherein the database records a relation between the ESD withstand voltage and the ESD decay rate, and the determination device determines an ESD withstand voltage of the semiconductor die by looking the relation up in the database according to the ESD decay rate.

8. The testing system for the semiconductor die as claimed in claim 5, further comprising:

a source measurement unit, selectively coupled to the semiconductor die and the determination device, measuring and outputting a first basic characteristic value of the semiconductor die before the testing ESD voltage is imposed on the semiconductor die, and measuring and outputting a second basic characteristic value of the semiconductor die after the testing ESD voltage is imposed on the semiconductor die, wherein the determination device obtains a basic characteristic shift of the semiconductor die corresponding to the testing ESD voltage according to a difference between the first basic characteristic value and the second basic characteristic value.

9. The testing system for the semiconductor die as claimed in claim 8, further comprising:

a switch, selecting to couple the semiconductor die to the source measurement unit or the current probe circuit.

10. The testing system for the semiconductor die as claimed in claim 8, further comprising:

a database, coupled to the determination device, wherein the database records a relation between the ESD withstand voltage and the basic characteristic offset, and the determination device determines an ESD withstand voltage of the semiconductor die by looking the relation up in the database according to the basic characteristic offset.

* * * * *